United States Patent [19]

Johnson et al.

[11] Patent Number: 4,982,360
[45] Date of Patent: Jan. 1, 1991

[54] MEMORY SUBSYSTEM

[75] Inventors: William N. Johnson, Sudbury; Le T. Nguyen, Hudson; Richard L. Sites, Boylston; Stanley A. Lackey, Littleton, all of Mass.

[73] Assignee: Digital Equipment Corporation

[21] Appl. No.: 534,927

[22] Filed: Sep. 22, 1983

[51] Int. Cl.[5] ............................................. G06F 12/10
[52] U.S. Cl. ................................................. 364/900
[58] Field of Search .............................. 371/10.1–10.3, 371/12; 364/200, 900

[56] References Cited

U.S. PATENT DOCUMENTS

| | | | |
|---|---|---|---|
| 3,422,402 | 1/1969 | Sakalay | 364/200 |
| 3,659,275 | 4/1972 | Marshall | 364/200 |
| 4,053,751 | 10/1977 | Ault | 371/21 |
| 4,093,985 | 6/1978 | Das | 364/200 |
| 4,095,278 | 6/1978 | Kihara | 364/900 |
| 4,376,300 | 3/1983 | Tsang | 371/10 X |
| 4,479,180 | 10/1984 | Miller et al. | 364/200 |

FOREIGN PATENT DOCUMENTS 1070431 1/1980 Canada .

OTHER PUBLICATIONS

*Microelectronics and Reliability*, vol. 15, No. 4, pp. 285–295, Pergamon Press, Oxford, Napoleon Cavlan: "Structure and Applications of Field Programmable Logic Arrays," p. 291, line 5–p. 292, line 19.

IEEE Transactions on Computers, vol. C-27, No. 9, Sep. 1978, *IEEE New York US*; CV Ramamoorthy et al.: "A Design of a Fast Cellular Associative Memory for Ordered Retrieval", p. 812, right handed col., lines 7–22.

Patent Abstracts of Japan, vol. 7, No. 90 (P-191, [1235], 14th Apr. 1983; & JP-A-58 16 350 (Tokyo Shibaura Denki KK), 31-01-1983.

*Primary Examiner*—David L. Clark
*Attorney, Agent, or Firm*—Nutter, McClennen & Fish

[57] ABSTRACT

A memory subsystem including a read-only memory (ROM), a random access read/write memory (RAM) and a selection system for selecting the output of one of the memories for use by downstream circuitry. The selection of the output is based on input address signals so that the contents of the RAM can substitute for the contents of selected locations in the ROM. If a substitution is to be made, an entry is made in a content addressable memory, which stores addresses for which the RAM output is to be substituted for ROM output. A test system is provided to verify the contents of the content addressable memory.

7 Claims, 5 Drawing Sheets

MEMORY SUBSYSTEM

BACKGROUND

The present invention deals with memory subsystems for computer systems, and more specifically with memory subsystems utilizing a combination of Read-Only Memory (ROM) and Random Access Memory (RAM) Arrays.

Memory technology has focused on the development of larger and faster discrete RAM or ROM arrays. When used in specific computer applications each type of array has inherent disadvantages. RAM arrays take up substantially more room than ROM arrays thus making it difficult to integrate a large RAM array in a very-large-scale-integration (VLSI) computer chip. RAM arrays are also volatile, thus requiring the additional cost of providing refresh media. ROM arrays are non-volatile, but their contents cannot be easily changed. Thus, applications using ROM arrays to store a control program inherently incur a higher cost in implementing changes to the code, which might be necessary to correct problems or improve features. The higher cost comes from replacing the obsolete ROM arrays in the field with a newly coded ROM array, plus the additional cost of the obsolete inventory of ROM arrays containing the old code. Combining discrete RAM and ROM parts into a multi-chip memory subsystem offsets some of these disadvantages, but incurs a high cost in the increased memory part count and interface logic.

SUMMARY OF THE INVENTION

The present invention provides for a single semiconductor chip which forms an integrated self-contained memory subsystem that can meet a variety of applications. It comprises three separate memory arrays: a mask-programmable ROM array, a RAM array and a content-addressable-memory (CAM) array. The three arrays share common latched address inputs, but are segmented into different address regions. All three arrays are accessed in parallel on every memory cycle. Based on the specified address region and external control signals, an internal multiplexer connects a selected array to the external data bus. The CAM array combines a write-only register with an exclusive-OR circuit that compares cell contents against incoming address data. If any preloaded CAM register matches an incoming address, the CAM array asserts a match signal, which can be used to provide asynchronous selection between RAM and ROM array outputs. Testing means are provided to verify that the CAM registers are correctly loaded and that the means for producing the match signal are working properly.

The combination of large mask-programmed ROM for program storage, smaller RAM for variable data storage, and a cascadable byte structure makes the subsystem an ideal memory building block for microcomputers. The internal address latch simplifies interfacing to multiplexed address/data busses. The common control/data interface for all arrays and the use of a static RAM also minimize the need for discrete control logic.

This part can also be used in a CPU's microprogrammed control store. The ROM could be programmed with microinstructions for a manufacturer's standard instruction set, while the RAM could be used as a writable control store for application-specific microcode, or to load and execute microdiagnostics.

The integral CAM permits construction of a sophisticated patchable control store. ROM instructions to be corrected or modified are trapped by addresses loaded into the CAM, and replaced by patch instructions loaded into the RAM. The patching mechanism is made transparent by configuring the chip(s) with the MATCH output directly controlling the internal output multiplexer. When a CAM match on a patch address occurs, the output multiplexer automatically switches to replace the bad ROM data with the new RAM data. The cascadability of the CAM array permits the number of trap addresses to expand as more memory chips are added to the system.

DESCRIPTION OF THE PREFERRED EMBODIMENT

Figure 1:
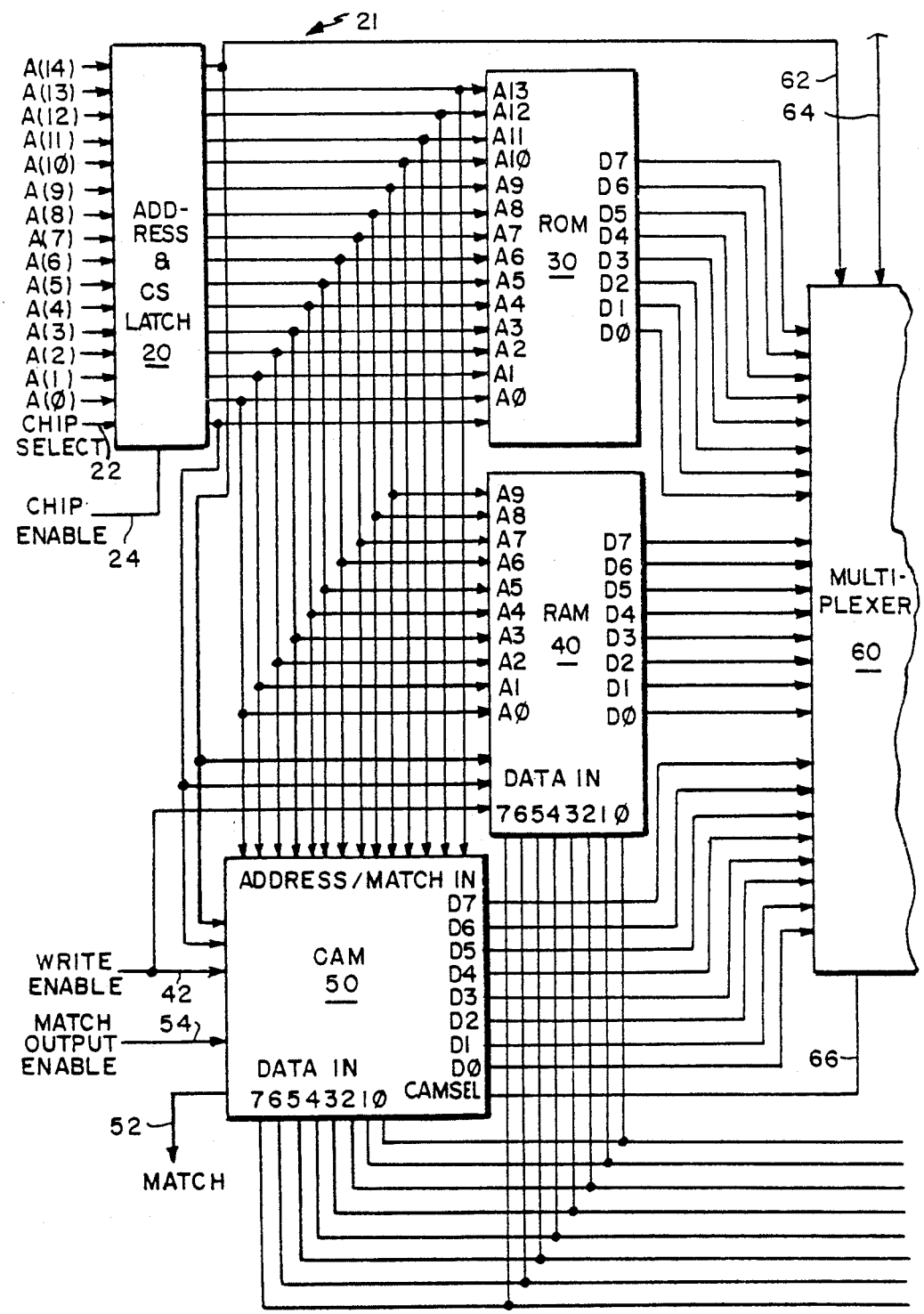
FIG. 1 shows a block diagram of the memory subsystem of the present invention.
Figure 1:
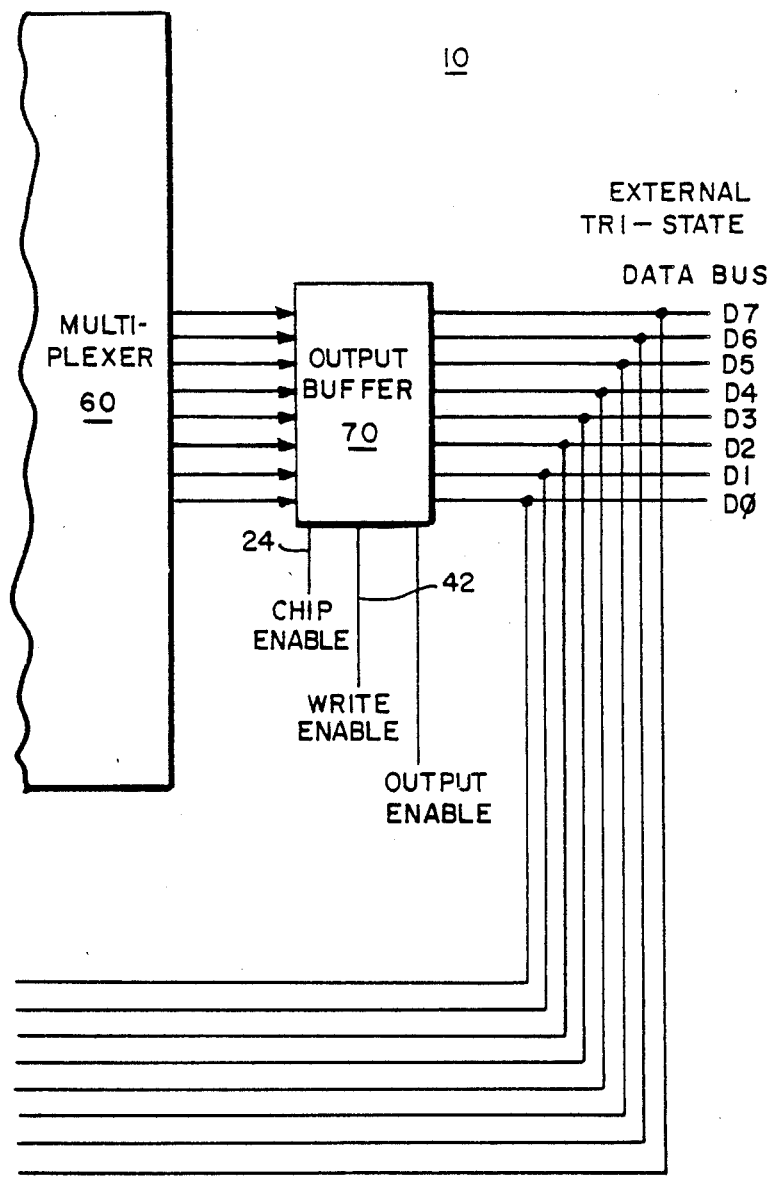

Referring now to FIG. 1, there is shown the Memory Subsystem 10 of the present invention. Memory Subsystem 10 is preferably implemented into one single integrated circuit. Memory Subsystem 10 includes Address and Chip Select Latch 20, ROM Array 30, RAM Array 40, CAM Array 50, Data Multiplexer 60 and Output Buffer 70. A brief overall explanation of the operation of the various blocks will be given first. The external Address Bus $A<14:0>$ and Chip Select Signal 22 are stored in Latch 20. The output of Latch 20 is connected in parallel to ROM 30, RAM 40 and CAM 50 over lines 21; thus, all three memory arrays are accessed simultaneously. Multiplexer 60 selects, in response to three control signals 62, 64 and 66, one of the three memory arrays for connection to Output Buffer 70. During normal operation, control signal 66, generated within CAM 50, is not asserted and as a consequence the output of CAM 50 is not selected by Multiplexer 60, limiting the selection between ROM 30 and RAM 40. If control signals 64 and 66 are both not asserted, then ROM 30 is selected. If either one of control signals 64 and 66 is asserted then RAM 40 is selected. Output Buffer 70 drives the contents of the selected memory array onto the External Data Bus $D<7:0>$. During a special mode of operation, the contents of the CAM 50 maybe written from the Data Bus lines $D<0-7>$, and the status of CAM 50 may be read by asserting CAM Select Control Signal 66.

Address/Chip Select Latch 20 holds the fourteen bits of Address Input $A<13:0>$, Chip Select Signal 22 and Address Input $A<14>$, which is used as multiplexer control signal 62 to select the RAM 40 if asserted. Latch 20 is controlled by Chip Enable Signal 24, whose pulsing is used to capture the input signals and ignore further transitions on the address bus.

ROM 30 is a read-only memory array of predetermined size, for instance $16K \times 8$ bits. It is addressed by bits $A<13:0>$ from the output of the Address Latch 20. After the pulsing of line 24 and if Chip Select 22 is asserted, ROM 30 is accessed and produces the contents of the addressed location, in this case eight bits of data, which are passed to Multiplexer 60.

RAM 40 is a random access memory of predetermined size having a width equal to the width of ROM 30; here it has a size of 1K×8 bits. It is addressed by bits A<9:0> from Latch 20. After the pulsing of line 24 and if Chip Select 22 is asserted, RAM 40 is either read or written depending upon an additional control signal called Write Enable 42. If Write Enable 42 is not asserted, a read cycle is initiated, and RAM 40 passes eight bits of read data to Multiplexer 60. If Write Enable 42 is asserted, a write cycle is initiated, and the addressed RAM location is written with the data present on the data bus D<7:0> inputs. During the write cycle the Output Buffer 70 is automatically turned off in response to the Write Enable signal 42 to prevent data contention on the External Data Bus D<7:0>. The end of a write cycle is achieved by deasserting either Write Enable Signal 42 or Chip Enable Signal 24.

Note that using a subset of the ROM address inputs for RAM addressing maps the ROM locations to RAM locations in a deterministic manner. Thus, when this subsystem is used as a patchable control store a ROM location and the corresponding patch location in RAM are accessed in parallel.

CAM 50 is a content addressable memory array having a width equal to the width of the largest address to be received, here it is a 32×14 bit array. The purpose of the CAM 50 is to permit selective detection of certain incoming addresses. When an incoming address matches one stored in the CAM array, the CAM logic asserts the open-collector or open-drain Match Output signal 52, if so enabled by the assertion of Match Output Enable Signal 54. The Match signal 52 can be used in two different ways in a patchable control store to permit substitution of RAM array output data for ROM array output data on the data bus D<7:0>. In the first way, the Match signal 52 is tied externally to the Multiplexer Control input signal 64. This way, Multiplexer 60 will select between ROM 30 and RAM 40 data as a function of the result of the CAM match. This mode effects the substitution of a patch RAM byte for a wrong ROM byte in a single cycle time of a duration at least as long as the amount of time needed to generate the Match Signal 52 plus the switching time of Multiplexer 60. In the second way, Match signal 52 is processed externally, for instance by a computer's microcode, to set control signal 64 as required in subsequent cycles.

Figure 2:
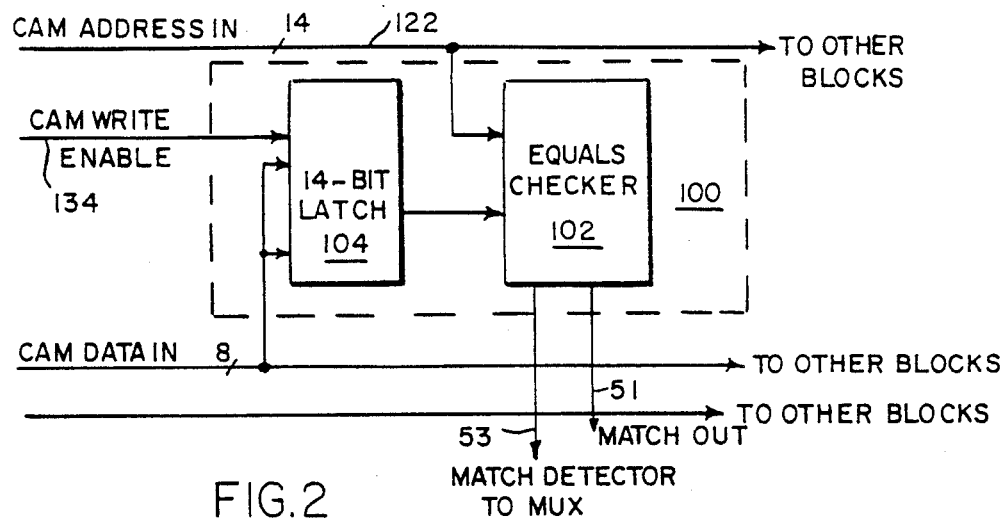
FIG. 2 shows a more detailed block diagram for one CAM cell used by the CAM array of the present invention.

Referring now to FIG. 2, there is shown one of the thirty-two 14-bit CAM registers 100 forming CAM 50. The CAM register 100 comprises a 14-bit Latch 104, that stores the trap addresses to be detected, and an Equals Checker 102 which compares the Latch 104 contents to CAM address inputs <13:0>, shown as lines 122, in each memory cycle. The Equals Checker 102, which may be implemented as an exclusive-OR circuit, outputs a Match Signal 52 if the Latch 104 contents equal the address inputs 122 across all fourteen bits. All 32 CAM registers 100 perform this comparison and output their individual match results in parallel.

Figure 3:
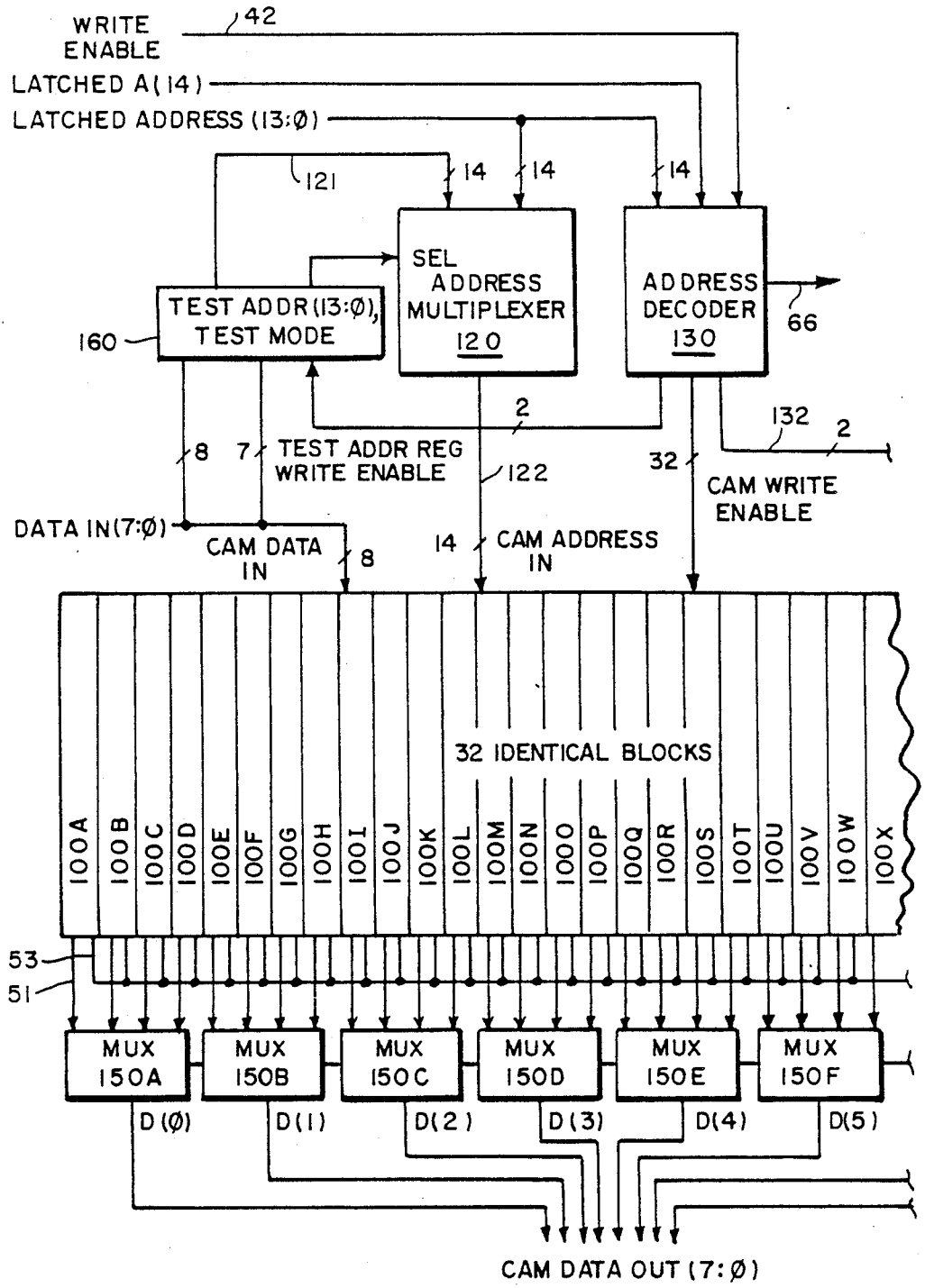
FIG. 3 shows a more detailed block diagram for the CAM array of the present invention.
Figure 3:
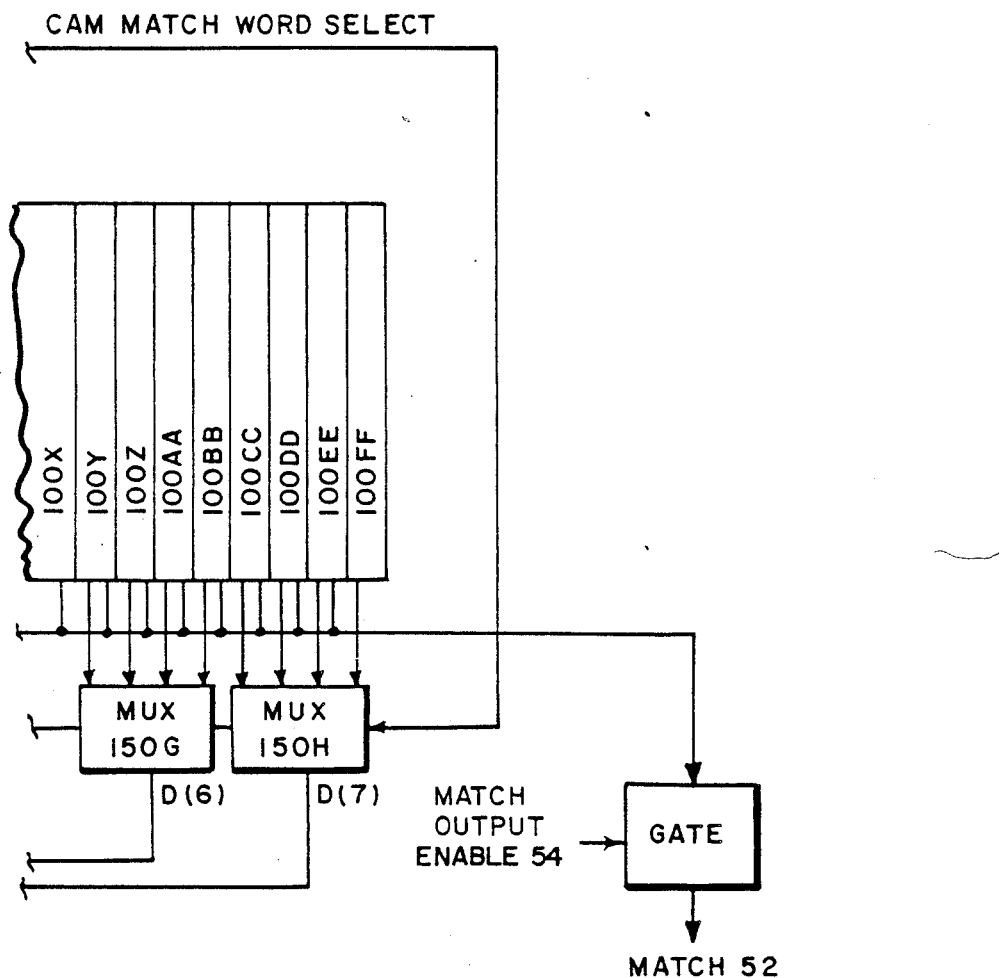

Referring now also to FIG. 3, address inputs 122 to the CAM array come from the Address Multiplexer 120 which connects either external address inputs 21, for normal operation, or test address inputs 121 for a special test mode described below. Trap addresses are written into the CAM from the external data bus inputs D<7:0>. Each CAM Register 100 can be uniquely written through a pair of reserved addresses. Two addresses per CAM register are needed since the fourteen bits of CAM data must be written in two discrete parts due to the 8-bit width limitation of the external data interface. Decoding of the reserved CAM addresses is performed by Address Decoder 130 which examines the address inputs on lines 21 on every memory cycle, and enables the appropriate CAM Write Enable Signal 134.

Table I lists the sixty-four reserved addresses (in octal notation) for the thirty-two CAM registers 100.

TABLE I

| A<14> | A<13:0> | Internal Structure Accessed |
|---|---|---|
| 0 | 00X00 | CAM Register 100A< 7:0>---write only (D<7:0>) |
| 0 | 00X01 | CAM Register 100A<13:8>---write only (D<5:0>) |
|   | 00X02 | CAM Register 100B< 7:0>---write only (D<7:0>) |
| 0 | 00X03 | CAM Register 100B<13:8>---write only (D<5:0>) |
| . | . | . |
| . | . |   |
| . | . | . |
| . | . |   |
| 0 | 00X76 | CAM Register 100FF<7:0>---write only (D<7:0>) |
| 0 | 00X77 | CAM Register 100FF<13:8>---write only (D<5:0>) |

Bits <8:6> of the CAM register address, marked as X in the table, are mask-programmed uniquely for each subsystem 10 used in a system to permit unique access to CAM registers on a per subsystem basis. In other words, the present invention allows the cascading of a plurality of subsystems 10 to build any desired memory system. The three mask programmable bits allow the cascading of up to eight subsystems. If the CAM is not used to trap addresses then there is no limit to the number of subsystems that can be cascaded. The subsystem can be stacked horizontally, to provide for a wider storage location (same number of words but more bits), by using a single Chip Select signal 22 for all the subsystems used. Alternatively the subsystem can be stacked vertically, to provide for more storage locations, by using a plurality of Chip Select Signals 22, one for each subsystem. By using more bits in the mask-programmable portion of the address, more than 8 subsystems can be stacked together. For instance, FIG. 4 shows an embodiment using both types of stacking to produce a M by N matrix of Memory Subsystems 10.

Figure 4:
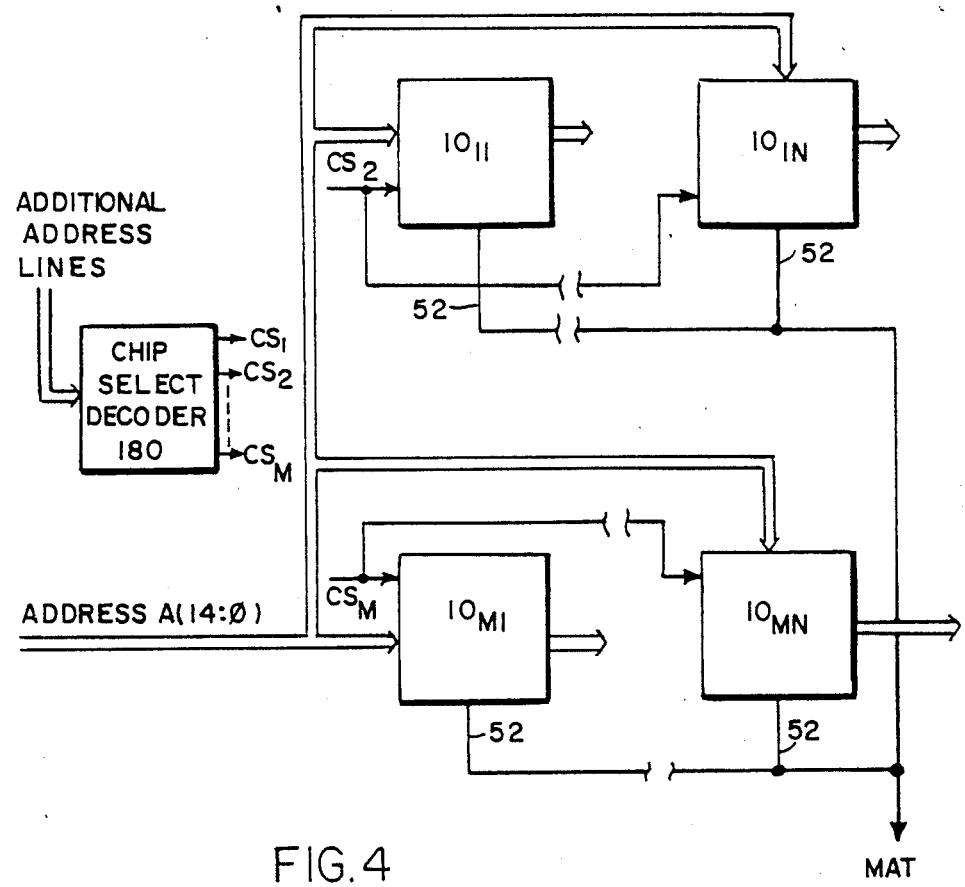
FIG. 4 shows the cascading of several memory subsystems to form a larger memory system.

With each subsystem providing, for instance, a 16K×8 ROM, a 1K×8 RAM and a 32×14 CAM, the M×N matrix shown in FIG. 4 provides overall a (M).(16K)×(N).(8) ROM, a (M).(1K)×(N).(8) RAM and a (M).(N).(32)×14 CAM.

Additional external address lines must be used by Chip Select Decoder 180 to decode the address and assert the required Chip Select for the required row.

The open-collector or open-drain Match signals are hard-wired together to generate an overall Match signal if any of them are asserted.

Referring now back to FIG. 3, it may be seen that although the write-only CAM Registers 100 cannot be explicitly read back, their contents can be verified through a special test mode. When this test mode is activated, a user-specified address is explicitly compared against the contents of all 32 CAM Registers simultaneously, with the individual match results readable on a per register basis. Thus, the contents of any given CAM register can be tested by inputting a test address that is identical to that written previously into the CAM and verifying that the particular CAM register indeed outputs a match response.

The test mode is activated by turning on the Test Mode Enable bit in the 15-bit Test Mode Register 140, which is also used to hold the 14-bit test address 121 to be compared against the CAM array. The Test Mode Enable bit signals the Address Multiplexer 120 to pass the test address 121 from Register 140, rather than the normal address lines 21 to the CAM for comparison. The 15 bits of the Test Mode Register 140 are loaded from the external 8-bit data bus in two successive write cycles using the two reserved addresses shown in Table II, which are used by Decoder 130 to generate the two test address register Write Enable Signals 136.

TABLE II

| A<14> | A<13:0> | Internal Structure Accessed |
|---|---|---|
| 0 | 01000 | CAM Test Address Reg. 140 <7:0>—write only (D<7:0>) |
| 0 | 01000 | CAM Test Address Reg. 140 <14:8>—write only (D<6:0>) |

The match/no match response 53 of each individual CAM Register 100 to the test address can be examined by performing a read operation to four reserved address locations that output the responses (0=no match; 1=match), eight registers at a time, onto the external eight-bit data bus. The response 53 of each register is uniquely assigned to a particular bit location in one of the four reserved address locations (see Table III).

TABLE III

| | SELECTED CAM REGISTER 100 MATCH STATE | | | | | | | |
|---|---|---|---|---|---|---|---|---|
| ADDRESS | D<7> | D<6> | D<5> | D<4> | D<3> | D<2> | D<1> | D<0> |
| 37774 | FF | BB | X | T | P | L | H | D |
| 37775 | EE | AA | W | S | O | K | G | C |
| 37776 | DD | Z | V | R | N | J | F | B |
| 37777 | CC | Y | U | Q | M | I | E | A |

Decoder 130 is used to detect those 4 reserved addresses and to control the match output in Multiplexers 150 that direct the individual CAM match responses 53 to the main output Multiplexer 60. Decoder 130 also drives the control line 66 which causes Multiplexer 60 to select the CAM data out <7:0>.

If a bad location of ROM 30 needs to be patched, the following steps are used First, the low order 10 address bits (A<9:0>) of the bad location are used to determine the corresponding RAM location to hold the patch. The new data is then loaded into that particular RAM location. The entire 14-bit ROM address is then loaded into any available CAM register, using the appropriate reserved address pair from Table I.

Proper loading of the RAM is checked by reading back the contents of the RAM location, using A<14> to connect the RAM array to the output bus. Proper loading of the CAM array is checked by loading the Test Mode Register 140 with the 14-bit address of the bad ROM location, while also turning on the Test Mode Enable bit. All four reserved test mode match addresses from Table III are then checked to see that only the desired CAM register written above matches the patch address.

To return to normal memory operation, the Test Mode Register 140 is rewritten to turn off the Test Mode Enable bit. From this point on, if the bad ROM location is addressed, the CAM array will detect this address and assert the external Match output, which can be used as described above to cause substitution of the good RAM data for the bad ROM data.

Note that the addresses for the CAM registers and the Test Mode register occupy the same address region as the ROM. Since the write-only CAM array uses these addresses only for write operations, and since the read-only ROM array uses these addresses only for read operations, there is no conflict in the overlap of these two sets of addresses.

Some modifications to the preferred embodiment will be apparent to those skilled in the art, for instance changing the size of the arrays or providing a different width for the various busses. Other modifications may be made without departing from the spirit and scope of the present invention. Accordingly, it is intended that this invention be not limited to the embodiments disclosed herein except as defined by the appended claims.

What is claimed is:

1. A memory system for receiving address signals, data signals, and a write enable signal, and for transmitting data signals in response thereto, comprising:
   (A) a first memory having an address input terminal, a data output terminal and a plurality of addressable storage locations;
   (B) a second memory having an address input terminal, a data output terminal, and a plurality of addressable storage locations;
   (C) address input means connected to said address input terminals of both said memories for transferring address signals to both said memories in parallel;
   (D) multiplexer means connected to said data output terminals of both said memories for selectively transmitting the data output signal from one of said memories in response to a selection signal; and
   (E) selection signal generating means including:
      (i) content addressable memory means including a plurality of storage locations each for storing an address, and a data input terminal adapted to receive the data signals;
      (ii) comparison means connected to said content addressable memory means and said address input means for generating said selection signal in response to an address signal from said address input means corresponding to the contents of a storage location in said content addressable memory means;
      (iii) a data output terminal connected to said multiplexer means for transmitting data signals to said multiplexer means;
      (iv) address decoding means for receiving the write enable signal and the address signals, and for enabling the storage locations identified by the address signals to latch the data signal at the data input terminal in response to the write enable signal, and for transmitting a signal in response to an address signal from said address input means, for enabling said multiplexer means to transmit signals from said data output terminal of said selection signal generating means; and (v) test means comprising:

(a) test latch means connected to said input terminal and said address decoding means for receiving and storing data signals in response to a signal from said address decoding means, said test latch means including an address portion and a test mode flag;

(b) address multiplexer means connected to said test latch means and said address input means for transferring the contents of said address portion of said test latch means or the signals from said address input means as address signals to select one of said storage locations in said content addressable memory means in response to the contents of said test mode flag; and (c) output means connected to said content addressable memory means, said multiplexer means, and said address decoder means to transfer the output of a selected storage location in said content addressable memory means to said multiplexer means in response to a signal from said address decoder means.

2. A memory system for receiving address signals, data signals and a write enable signal and for transmitting data signals in response thereto, the memory system comprising:

(a) first and second memories each having an address input terminal, a data output terminal and a plurality of addressable storage locations;

(b) content addressable memory means including a plurality of storage locations each for storing an address for generating a selection signal in response to the receipt of address signals corresponding to the contents of one of the storage locations and for further generating at a data output terminal a data output signal;

(c) address input means connected to said address input terminals of both said first and second memories for transferring address signals to both said memories in parallel;

(d) data multiplexer means connected to said data output terminals of both said first and second memories and said content addressable storage means for selectively transmitting the data output signal from one of said memories or said content addressable storage means in response to the selection signal;

(e) address multiplexer means connected to receive said address signals and further connected to said content addressable storage means for transferring said address signals from said address input means or a test address which is transferred to said content addressable storage means in response to a test mode status signal; and (f) test mode means including test mode information storage means for storing the test address and a test mode status, said test mode means generating said test mode status signal in response to the contents of said test mode status storage means.

3. A memory system as defined in claim 2 wherein said content addressable storage means includes a plurality of address storage means each for storing an address and a corresponding plurality of comparison means each connected to one of said storage means, said comparison means further being connected to said address input means for receiving said address signals and generating said selection signal in response to the address signals corresponding to the address in the associated storage means.

4. A memory system as defined in claim 3 wherein said content addressable storage means further includes means for receiving data signals and address decoder means connected to receive a write enable signal and further connected to said address input means and to all of said address storage means for enabling one of said address storage means identified by said address signals from said address input means to store the data signals in response to the write enable signal.

5. A memory system as defined in claim 4 wherein said test mode means is further connected to receive said data signals and further connected to said address decoder means, said address decoder means enabling said test mode means to store the data signals in response to the address from said address input means and said write enable signal.

6. A memory system as defined in claim 3 wherein said content addressable storage means includes data signal generating means connected to said address storage means for generating said data output signal in response to the one of the address storage means which contains the address corresponding to the contents of said address input means.

7. A memory system as defined in claim 6 wherein said address storage means are divided into a plurality of groups, said data signal generating means generating the data output signal in response to the contents of the particular address storage means identified by the address signals from said address input means.

* * * * *